United States Patent
Yanagisawa et al.

(10) Patent No.: US 8,552,328 B2
(45) Date of Patent: Oct. 8, 2013

(54) METHOD OF REPAIRING THE DETERIORATION OF MAGNETO-RESISTIVE EFFECT DEVICE

(75) Inventors: Takumi Yanagisawa, Tokyo (JP); Yosuke Antoku, Tokyo (JP); Yoshikazu Sawada, Tokyo (JP)

(73) Assignee: TDK Corporation, Tokyo (JP)

( * ) Notice: Subject to any disclaimer, the term of this patent is extended or adjusted under 35 U.S.C. 154(b) by 1430 days.

(21) Appl. No.: 11/966,025

(22) Filed: Dec. 28, 2007

(65) Prior Publication Data

US 2009/0168255 A1 Jul. 2, 2009

(51) Int. Cl.
*G11B 5/37* (2006.01)

(52) U.S. Cl.
USPC ............... 219/50; 29/603.08; 360/313

(58) Field of Classification Search
None
See application file for complete search history.

(56) References Cited

U.S. PATENT DOCUMENTS

| | | | | |
|---|---|---|---|---|
| 5,997,698 | A * | 12/1999 | Mino et al. | 204/192.2 |
| 6,275,028 | B1 * | 8/2001 | Matsui et al. | 324/210 |
| 7,250,237 | B2 * | 7/2007 | Ottens et al. | 430/30 |
| 7,525,773 | B2 * | 4/2009 | Shimazawa et al. | 360/324.11 |
| 7,780,344 | B2 * | 8/2010 | Yanagisawa et al. | 374/57 |
| 8,023,214 | B2 * | 9/2011 | Yanagisawa et al. | 360/31 |
| 2002/0041183 | A1 * | 4/2002 | Liu et al. | 324/210 |
| 2002/0113587 | A1 * | 8/2002 | Kim | 324/210 |
| 2005/0219725 | A1 * | 10/2005 | Ozanoglu et al. | 360/25 |
| 2006/0072249 | A1 * | 4/2006 | Wakui et al. | 360/324.1 |
| 2007/0274006 | A1 * | 11/2007 | Yamaguchi et al. | 360/264 |
| 2008/0054889 | A1 * | 3/2008 | Kikuiri et al. | 324/207.21 |
| 2008/0054895 | A1 * | 3/2008 | Sasaki et al. | 324/252 |
| 2008/0137233 | A1 * | 6/2008 | Otsuki et al. | 360/240 |
| 2010/0237859 | A1 * | 9/2010 | Kotter et al. | 324/252 |

FOREIGN PATENT DOCUMENTS

| | | | |
|---|---|---|---|
| JP | 09-219002 A | * | 8/1997 |
| JP | 2001-67619 | | 3/2001 |
| JP | 2002-312912 | | 10/2002 |
| JP | 2005-108306 | | 4/2005 |

* cited by examiner

*Primary Examiner* — Kiley Stoner
(74) *Attorney, Agent, or Firm* — Oblon, Spivak, McClelland, Maier & Neustadt, L.L.P.

(57) ABSTRACT

The invention provides a method for fixing up the deterioration of a magneto-resistive effect device. A hard disk system is provided in it with a head heating means for heating a thin-film magnetic head, and by that head heating means, a defective site of the magneto-resistive effect device, which occurs as the hard disk system is in operation and is confined in a quasi-stable state, is fixed up in such a way as to return back to its own normal stable state. Thus, the deteriorated site of the magneto-resistive effect device (reproducing device) in the thin-film magnetic head, which is caused by the so-called thermal asperity as the hard disk system is in operation, is fixed up while it remains built in the hard disk system, i.e., without dismantling the hard disk system.

10 Claims, 8 Drawing Sheets

METHOD OF REPAIRING THE DETERIORATION OF MAGNETO-RESISTIVE EFFECT DEVICE

BACKGROUND OF THE INVENTION

1. Field of the Invention

The present invention relates to a method of fixing up a deteriorated site of the magneto-resistive effect device (reproducing device) in a thin-film magnetic head caused by the so-called thermal asperity occurring as a hard disk system is in operation, while that device remains incorporated in the hard disk system without dismantling it.

2. Explanation of the Prior Art

With recent improvements in the plane recording density of hard disk systems, there has been growing demands for improvements in the performance of thin-film magnetic heads. For the thin-film magnetic head, a composite type thin-film magnetic head has been widely used, which has a structure wherein a reproducing head having a read-only magneto-resistive effect device (hereinafter often referred to as the MR (magneto-resistive) device for short) and a recording head having a write-only induction type magnetic device are stacked on a substrate.

For the MR device, there is the mention of an AMR device harnessing an anisotropic magneto-resistive effect, a GMR device tapping a giant magneto-resistive effect, a TMR device making use of a tunnel-type magneto-resistive effect, and so on.

With regard to thin-film magnetic heads having various such magneto-resistive effect devices mounted on them, it has been reported that there is often the thermal asperity defect caused as an inherent one (see JP(A)2005-108306).

The thermal asperity is a phenomenon that occurs when a thin-film magnetic head passes over a magnetic disk plane that is a recording medium while levitating and flying over minute bumps or dents, because the magneto-resistive effect device is heated or cooled via the adiabatic compression and/or adiabatic expansion of air.

Of course, that phenomenon occurs not only in a non-contact state but also in a contact state where the magneto-resistive effect device is in contact with minute bumps or dents on the magnetic disk plane. When the head is in collision with minute asperities, there is a local, vigorous heating occurring due to mechanical vibrations and, at the same time, instantaneous friction. Such local heating is supposed to occur for a very short period in which the head passes over the asperities, and propagate right away to the whole device. When heat shocks propagate as if they were waves, the device is supposed to undergo repeated local expansion and local shrinkage.

How a typical deterioration by the thermal asperity occurs is now explained with reference to FIGS. 8A and 8B with an applied magnetic field as abscissa and the ensuing device resistance change as ordinate. Typical initial characteristics are shown in FIG. 8A. In the initial state with none of the deteriorations of the device, there is a linear resistance change vs. the applied magnetic field.

By contrast, FIG. 8B shows the characteristics of a device deteriorated by the thermal asperity while an HDD (hard disk drive system) is practically on the run. In FIG. 8B, there is a stepwise resistance change (kink) vs. the applied magnetic field. From the experience so far, it has been found that most of the deteriorations caused by the thermal asperity occur in this mode.

In a possible deterioration model (1), it would appear that a part of a bias magnetic field-applying layer is flipped over by heat shocks. A magneto-resistive effect film does not show any linearity in general, and a given magnetic field is applied to it from an externally located bias magnetic field-applying layer to keep the linearity of its characteristics. With a part of the bias layer flipped over, however, the bias magnetic field wanes resulting in the inability to give a good enough bias magnetic field to the magneto-resistive effect device: this could render the MR characteristics nonlinear.

In another possible deterioration model (2), there would be a phenomenon occurring, in which the pin direction of a pinned layer that is a so-called fixed magnetization layer is off normal.

One possible way of fixing up such deterioration models (1) and (2) is to fix up the deterioration by the application of a high magnetic field of a few KOe (oersteds). However, much difficulty would be encountered in the incorporation in common hard disk systems of a mechanism that generates a fixing magnetic field. Further, the application of a high magnetic field of a few KOe (oersteds) may possibly have adverse influences on the stability and reliability of operation of the device.

The situations being like this, the invention has been made for the purpose of a novel yet very effective method of fixing up a deteriorated site in the magneto-resistive effect device (reproducing device) in a thin-film magnetic head caused by the so-called thermal asperity occurring as a hard disk system is in operation, while that device remains incorporated in the hard disk system without dismantling it.

It is here noted that the prior art that would seem pertinent to the invention of this application is JP(A) 2001-67619. This prior art comes up with a method in which, before a ferromagnetic tunnel junction device is actually in use, a current is passed through it for a given time in a high-temperature atmosphere, thereby stabilizing the resistance value of an insulating film during actual use. This prior art shows operation implemented before actual use. By contrast, the invention of this application is directed to fixing operation that is implemented when device malfunction is found after it has been actually in use while remaining incorporated in a hard disk system: it is quite different in construction and advantages from that prior art.

SUMMARY OF THE INVENTION

To accomplish the aforesaid object, the invention of this application provides a method for fixing up the deterioration of a magneto-resistive effect device in a thin-film magnetic head built in a hard disk system, wherein a head heating means for heating the thin-film magnetic head is provided in the hard disk system, and without dismantling the hard disk system, said heat heating means is operated to heat a defective site of the magneto-resistive effect device which occurs as the hard disk system is in operation and is confined in a quasi-stable state in such a way as to return back to its own normal stable state, thereby fixing up the deterioration of the device.

In a preferable embodiment of the invention, said head heating means is a heater mechanism built in the thin-film magnetic head.

In a preferable embodiment of the invention, said head heating means is a heating pad located at a standby position for the thin-film magnetic head.

In a preferable embodiment of the invention, the defective site of said magneto-resistive effect device confined in the quasi-stable state is a bias magnetic field-applying layer for applying a bias to said device.

In a preferable embodiment of the invention, the defective site of said magneto-resistive effect device confined in the quasi-stable state is a fixed magnetization layer that forms a part of said device.

In a preferable embodiment of the method for fixing up the deterioration of the magneto-resistive effect device according to the invention, said hard disk system comprises a slider located in opposition to a recording medium, a positioning device for supporting said slider and positioning said slider with respect to said recording medium, and a magneto-resistive effect device formed at a surface of said slider in opposition to the recording medium.

In a preferable embodiment of the method for fixing up the deterioration of the magneto-resistive effect device according to the invention, said magneto-resistive effect device has a CPP (current perpendicular to plane) structure comprising a spacer layer, and a first ferromagnetic layer and a second ferromagnetic layer stacked and formed such that said spacer layer is sandwiched between them, with a sense current applied in a stacking direction, wherein said device structure is provided with bias magnetic field-applying layers on both ends in its widthwise direction.

BRIEF EXPLANATION OF THE DRAWINGS

FIG. 8A is a graph indicative of an initial state of the device before the occurrence of the thermal asperity deteriorations and FIG. 8B is a graph indicative of the state of the device after the occurrence of the thermal asperity deteriorations.

EXPLANATION OF THE PREFERRED EMBODIMENTS

The best mode for carrying out the invention is now explained in details.

Prior to explaining how to fix up the deteriorations of a magneto-resistive effect device according to the invention, reference is made to a typical arrangement of the magneto-resistive effect device to be fixed up for deterioration by the inventive fixing method as well as an arrangement of a thin-film magnetic head comprising that magneto-resistive effect device.

It is here noted that if the magneto-resistive effect device to be fixed up can function such that the state of magnetic layers changes relatively depending on an external magnetic field, there is then no particular limitation to the type and structure of the device.

[Explanation of a Typical Arrangement of the Magneto-Resistive Effect Device]

A giant magneto-resistive effect device of the CPP structure (the CPP-GMR device) is now explained as a typical example of the magneto-resistive effect device.

Figure 1:
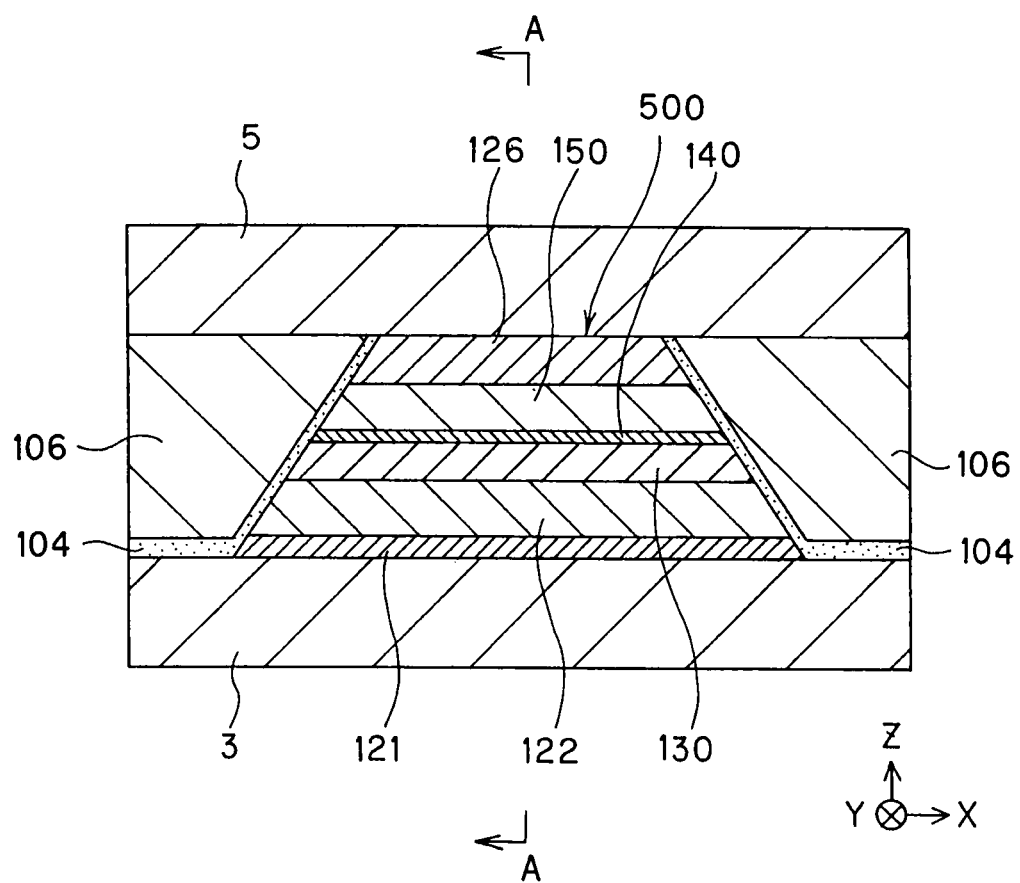
FIG. 1 is illustrative in section parallel with the medium opposite plane of an embodiment of the invention, especially the reproducing device of a reproducing head.

FIG. 1 is illustrative of the ABS (air bearing surface) of a reproducing head in an embodiment of the invention; FIG. 1 is illustrative in schematic of the ABS of the giant magneto-resistive effect device (CPP-GMR device) having the CPP structure in particular. The ABS is corresponding to a plane (hereinafter often called the medium opposite plane) at which a reproducing head is in opposition to a recording medium; however, it is understood that the ABS here includes even a section at a position where the multilayer structure of the device can be clearly observed. For instance, a protective layer of DLC or the like (the protective layer adapted to cover the device), in a strict sense, positioned facing the medium opposite plane may be factored out, if necessary.

Figure 2:
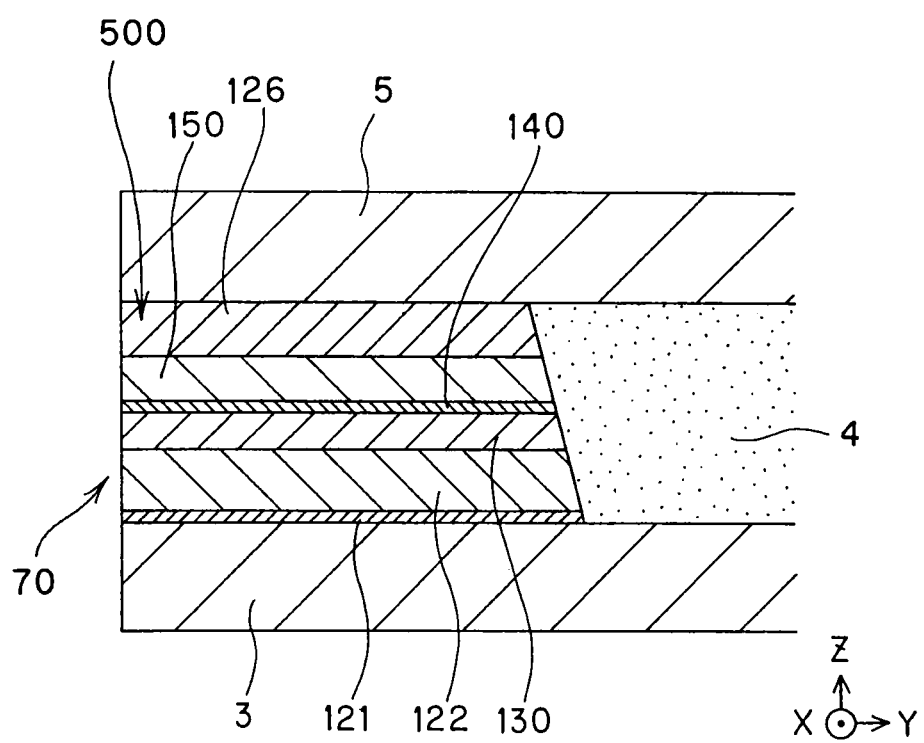
FIG. 2 is a view as taken on the arrowed A-A section of FIG. 1.

FIG. 2 is a view as taken on the arrowed A-A section of FIG. 1.

In the following disclosure of the invention, the sizes of each device component in the X-, Y- and Z-axis directions shown in the drawings will be referred to as the "width", "length" and "thickness", respectively. The side of the device nearer to the air bearing surface (the plane of the thin-film magnetic head in opposition to the recording medium) in the Y-axis direction will be called "forward" and the opposite side (depth-wise side) will be called "rearward", and the direction of stacking the individual films up will be called "upward" or "upper side" and the opposite direction will be called "downward" or "lower side".

As shown in FIG. 1, the reproducing head according to the embodiment here comprises a first shield layer 3 (also called the lower shield layer 3) and a second shield layer 5 (also called the upper shield layer 5) that are located at a given space and opposed vertically on the sheet, a giant magneto-resistive effect device 500 of the CPP structure (hereinafter referred to as the GMR device 500 for short) interposed between the first shield layer 3 and the second shield layer 5, and an oxide insulating film 104 formed directly on two sides of the GMR device 500 (see FIG. 1). Note here that in the rear (see FIG. 2) of the GMR device 500, there is a refill layer 4 formed that is an insulating layer.

Further, as shown in FIG. 1, two bias magnetic field-applying layers 106 are formed on two sides of the GMR device 500 via the insulating layer 104.

In the embodiment here, the first 3 and the second shield layer 5 take a so-called magnetic shield role plus a pair-of-electrodes role. In other words, they have not only a function of shielding magnetism but also function as a pair of electrodes adapted to pass a sense current through the GMR device 500 in a direction intersecting the plane of each of the layers forming the GMR device 500, for instance, in a direction perpendicular to the plane of each of the layers forming the GMR device 500 (stacking direction).

Apart from the first 3 and the second shield layer 5, another pair of electrodes may be additionally provided above and below the device.

Referring to the GMR device 500 having the CPP structure here in terms of a broad, easy-to-understand concept, it comprises a nonmagnetic spacer layer 140, and a first ferromagnetic layer 130 and a second ferromagnetic layer 1540 stacked together with the spacer layer 140 sandwiched between them, as shown in FIG. 1. The first ferromagnetic layer 130 and the second ferromagnetic layer 150 function such that the angle made between the directions of magnetizations of both layers changes relatively depending on an external magnetic field.

Referring here to a typical embodiment of the invention, the first ferromagnetic layer 130 functions as a fixed magnetization layer (the pinned layer) having its magnetization fixed, and the second ferromagnetic layer 150 functions as a free layer having a direction of its magnetization changing depending on an external magnetic field, i.e., a signal magnetic field from a recording medium. It follows that the first ferromagnetic layer 130 is the fixed magnetization layer 130, and the second ferromagnetic layer 150 is the free layer 150.

The fixed magnetization layer 130 has its magnetization direction fixed under the action of an antiferromagnetic layer 122. While an embodiment with the antiferromagnetic layer 122 formed on the substrate side (the side of the first shield layer 3) is shown in FIG. 1, it is contemplated that the antiferromagnetic layer 122 may be formed on the top side (the side of the second shield layer 5) to interchange the free layer 150 and the fixed magnetization layer 130 in position.

In what follows, the layers forming the GMR device 500 are each now explained in greater details.

(Explanation of the Fixed Magnetization Layer 130)

In the invention, the fixed magnetization layer 130 is formed on the antiferromagnetic layer 122 having a pinning action via an underlay layer 121 formed on the first shield layer 3.

The fixed magnetization layer 130 may be in either a single-layer film form or a multilayer film form.

In a preferable embodiment of the invention wherein the fixed magnetization layer 130 is a multilayer film, it has a so-called synthetic pinned layer comprising, in order from the side of the antiferromagnetic layer 122, an outer layer, a nonmagnetic intermediate layer and an inner layer, all stacked together in order.

The outer layer, and the inner layer is provided by a ferromagnetic layer made of, for instance, a ferromagnetic material containing Co, and Fe. The outer layer and the inner layer are antiferromagnetically coupled and fixed such that their magnetization directions are opposite to each other.

The outer layer, and the inner layer is preferably made of, for instance, a $Co_{70}Fe_{30}$ (atomic %) alloy. The outer layer has a thickness of preferably about 3 to 7 nm, and the inner layer has a thickness of preferably about 3 to 10 nm.

For instance, the nonmagnetic intermediate layer is made of a nonmagnetic material containing at least one selected from the group consisting of Ru, Rh, Ir, Re, Cr, Zr and Cu, and has a thickness of, for instance, about 0.35 to 1.0 nm. The nonmagnetic intermediate layer is provided to fix the magnetization of the inner layer and the magnetization of the outer layer in mutually opposite directions.

(Explanation of the Free Layer 150 and Cap Layer 126)

The free layer 150 has its magnetization direction changing depending on an external magnetic field, i.e., a signal magnetic field from the recording medium, and is made of a ferromagnetic layer (soft magnetic layer) having a small coercive force. The free layer 150 has a thickness of, for instance, about 2 to 10 nm, and may be in either a single layer form or a multilayer form including a plurality of stacked ferromagnetic layers.

On such free layer 150, there is a cap layer 126 (protective layer 126) formed, which comprises a Ta or Ru layer as an example, as shown in FIG. 1. The cap layer 126 has a thickness of about 0.5 to 20 nm.

(Explanation of the Nonmagnetic Spacer Layer 140)

The nonmagnetic spacer layer 140 is made of at least one or more materials selected from the group of consisting of $Al_2O_3$, MgO, Cu, Ag, Au, Pt, Al, ZnO, $SiO_2$, $TiO_2$, $ZnO_2$, HfO and so on, and has a thickness of about 1.0 to 3.0 nm.

(Explanation of the Antiferromagnetic Layer 122)

The antiferromagnetic layer 122 functioning as the pinning layer works such that by way of exchange coupling with the fixed magnetization layer 130 as described above, the magnetization direction of the fixed magnetization layer 130 is fixed.

For instance, the antiferromagnetic layer 122 is made of an antiferromagnetic material containing at least one element M' selected from the group of Pt, Ru, Rh, Pd, Ni, Cu, Ir, Cr and Fe, and Mn. The content of Mn is preferably 35 to 95 at %. The antiferromagnetic material is broken down into two types: (1) a non-heat treatment type antiferromagnetic material that shows anti-ferromagnetism even in the absence of heat treatment to induce an exchange coupling magnetic field between it and a ferromagnetic material, and (2) a heat treatment type antiferromagnetic material that comes to show anti-ferromagnetism by heat treatment. In the invention, both types (1) and (2) may be used without restriction. For instance, the non-heat treatment type antiferromagnetic material is exemplified by RuRhMn, FeMn, and IrMn, and the heat treatment type antiferromagnetic material is exemplified by PtMn, NiMn, and PtRhMn.

The antiferromagnetic layer 122 has a thickness of about 5 to 30 nm.

It is here noted that for the layer for fixing the magnetization direction of the fixed magnetization layer 130, it is acceptable to use a hard magnetic layer comprising a hard magnetic material such as CoPt in place of the aforesaid antiferromagnetic layer.

The underlay layer 121 formed below the antiferromagnetic layer 122 is provided to improve the crystallization and orientation of each of the layers stacked on it in general, and the exchange coupling of the antiferromagnetic layer 122 and the fixed magnetization layer 130 in particular. For such underlay layer 121, for instance, a multilayer structure of Ta and NiCr layers is used. The underlay layer 121 has a thickness of about 2 to 6 nm as an example.

Further, the material that forms the insulating layer 104 shown in FIG. 1, for instance, includes alumina. For the bias magnetic field-applying layers 106, for instance, a hard magnetic layer (hard magnet) or a multilayer assembly of a ferromagnetic layer and an antiferromagnetic layer may be used; specifically, CoPt or CoCrPt is mentioned.

(Explanation of the Whole Structure of the Thin-Film Magnetic Head)

One preferable, exemplary whole structure of the thin-film magnetic head according to the invention is now explained with reference to FIGS. 3A, 3B, 4 and 5.

Figure 3B:
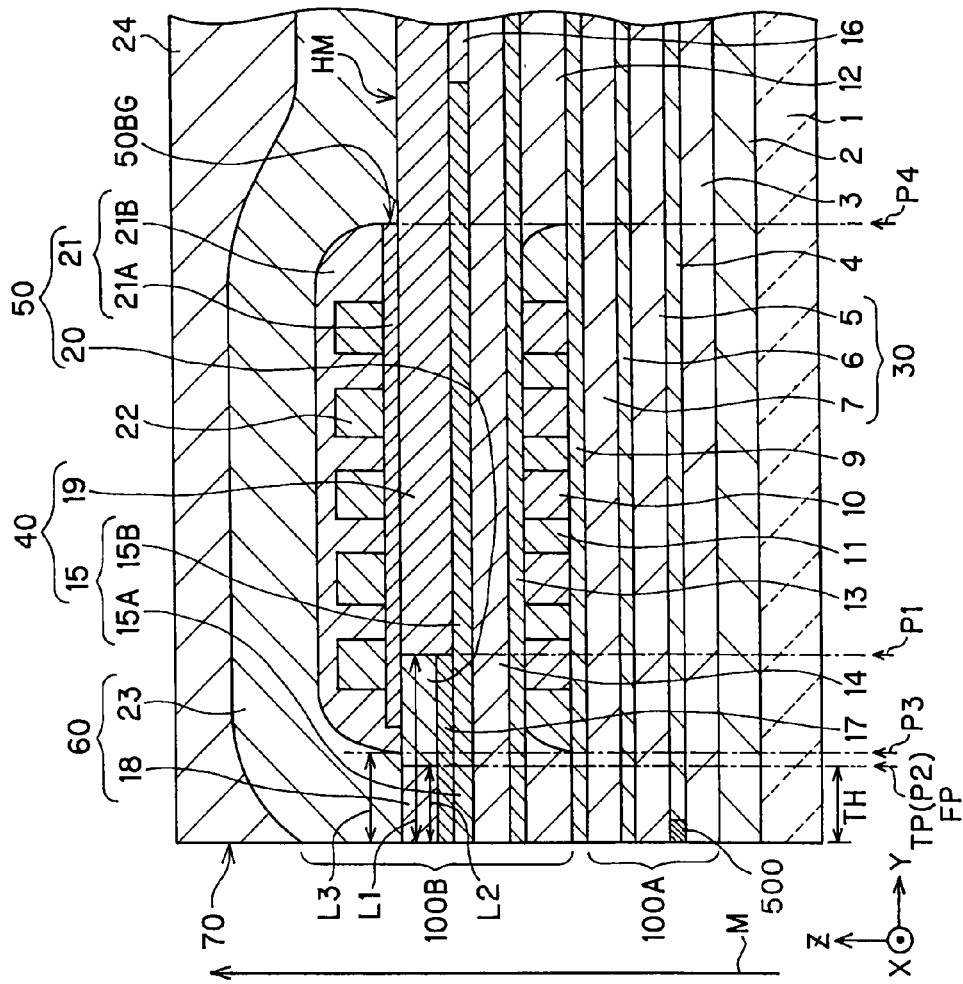
FIG. 3B is a sectional view of the thin-film magnetic head orthogonal to the air bearing surface.
Figure 3A:
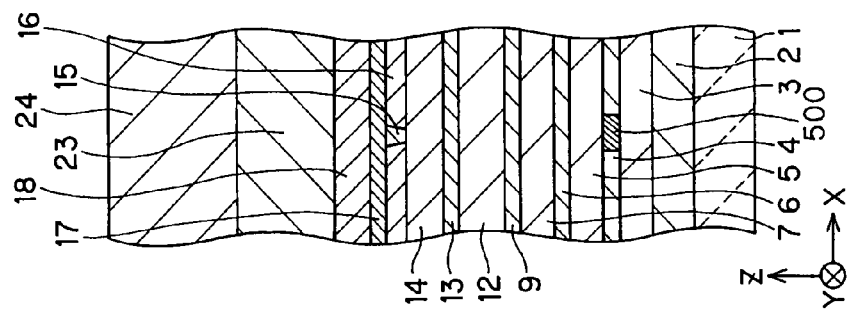
FIG. 3A is a sectional view of the thin-film magnetic head parallel with the so-called air bearing surface (ABS)
Figure 4:
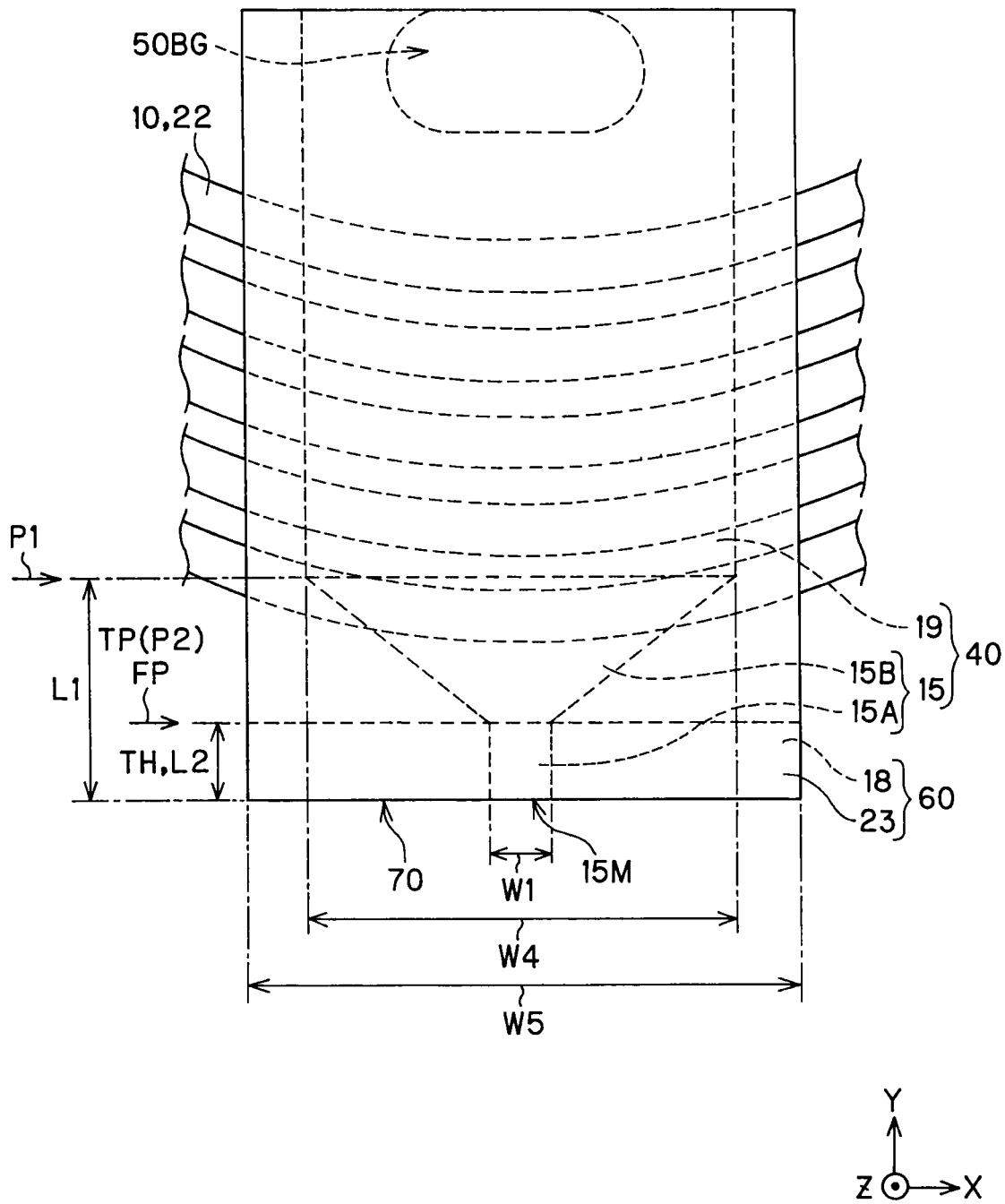
FIG. 4 is an enlarged perspective view of a portion of the write head near the magnetic pole layer.
Figure 5:
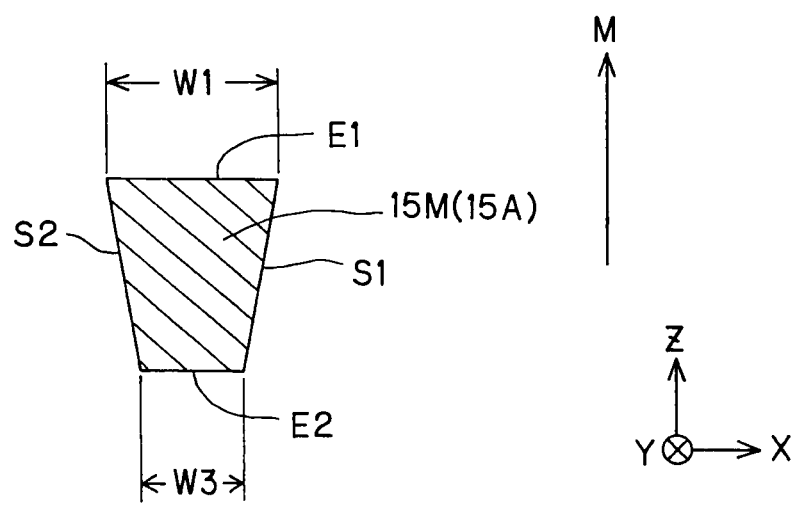
FIG. 5 is illustrative of the morphology of the end portion of the main magnetic pole at the air bearing surface.

FIG. 3A is a sectional view of the thin-film magnetic head parallel with the so-called air bearing surface (ABS), and FIG. 3B is a sectional view of the thin-film magnetic head orthogonal to the air bearing surface. The air bearing surface (ABS) here is tantamount to the plane at which the thin-film magnetic head is in opposition to the magnetic recording medium (hereinafter also called the medium opposite plane). FIG. 4 is an enlarged perspective view of a portion of the write head near the magnetic pole layer for implementing perpendicular magnetic recording, and FIG. 5 is illustrative of the morphology of the end portion of the main magnetic pole at the air bearing surface.

The thin-film magnetic head shown in FIGS. 3A and 3B is mounted on, and used with, a magnetic recording system such as a hard disk drive for the purpose of applying magnetic processing to a recording medium like a hard disk moving in the medium travel direction M.

For instance, the thin-film magnetic head illustrated in the drawings is a composite type head capable of implementing both recording and reproducing as magnetic processing. The structure comprises, as shown in FIG. 3, a substrate 1 made of a ceramic material, and an insulating layer 2 made of a nonmagnetic insulating material, a reproducing head portion 100A adapted to reproduce magnetic information recorded by harnessing the magneto-resistive (MR) effect, a separation layer 9 made of a nonmagnetic insulating material, a shield type recording head portion 100B adapted to implement a perpendicular recording mode of recording processing, and an overcoat layer 24 made of a nonmagnetic insulating material, all stacked one upon another on the substrate 1 in that order.

In the embodiment illustrated, the reproducing head portion 100A has a multilayer structure comprising a lower read shield layer 3, a magneto-resistive effect device 500, and a shield layer 5 (in this embodiment, a part of an upper read shield layer 30) stacked one upon another in that order. At the rear end face of the magneto-resistive effect device 500 there is a shield gap layer 4 (refill layer 4) formed.

In the embodiment shown in FIGS. 3A and 3B, both the lower 3 and the upper read shield layer 30 are provided to separate the magneto-resistive effect device magnetically from the surroundings.

In the embodiment here, the upper read shield layer 30 is divided into two shield layers 5 and 7 in its thickness direction with a nonmagnetic layer 6 held between them.

The upper first read shield layer 5 is made of a magnetic material such as permalloy. The upper second read shield layer 7 is likewise made of a magnetic material such as permalloy. The nonmagnetic layer 6 is made of a nonmagnetic material such as ruthenium (Ru) or alumina.

While it is shown and described that the upper read shield layer 30 has a multilayer structure, it is contemplated that it is not always required to have a multilayer structure; it could have a single-layer structure as is the case with the lower read shield layer 3.

The shield gap film 4, for instance, made of a nonmagnetic material such as alumina.

The recording head portion 100B, for instance, has a multilayer structure comprising a first-stage thin-film coil 10 buried around with insulating layers 11, 12, 13, a nonmagnetic layer 14, a main magnetic pole layer 40 partially buried around with an insulating layer 16, a gap layer 17, a second-stage thin-film coil 22 buried with an insulating layer 50 that forms a magnetic coupling opening (back gap 50BG) and a write shield layer 60, all stacked one upon another in order.

The thin-film coil 10 has a primary function of generating a leakage-preventive magnetic flux for holding back leakage of a recording magnetic flux produced at the thin-film coil 22.

The thin-film coil 10 typically operates such that currents flow in a direction opposite to the direction taken by currents flowing through the thin-film coil 22.

The insulating layers 11, 12, 13 are formed in such a way as to separate the thin-film coil 10 electrically from the surroundings. The insulating layer 11 is formed in such a way as to be filled up between the turns of the thin-film coil 10 and provide a cover around the thin-film coil 10. This insulating layer 11 is made of a nonmagnetic insulating material such as a photoresist.

The insulating layer 12 is formed in such a way as to provide a cover around the insulating layer 11. This insulating layer 12 is made of a nonmagnetic material such as alumina.

The insulating layer 13 is formed in such a way as to give a cover to the thin-film coil 10 as well as the insulating layers 11, 12. This insulating layer 13 is made of a nonmagnetic material such as alumina.

The nonmagnetic layer 14 is formed of a nonmagnetic insulating material such as alumina, or a nonmagnetic electroconductive material such as ruthenium.

The main magnetic pole layer 40 has a primary function of implementing recording processing by receiving a magnetic recording magnetic flux produced at the thin-film coil 22 and releasing that magnetic flux toward the recording medium for implementing recording processing. More specifically, the main magnetic pole layer 40 is to generate a magnetic field (perpendicular magnetic field) to magnetize the recording medium in a direction orthogonal to its surface on the basis of a recording magnetic flux, thereby implementing recording processing in the perpendicular recording mode.

Such main magnetic pole layer 40 is located on the leading side of the thin-film coil, extending rearward from the air bearing surface 70, more specifically, as far as the back gap 50BG.

In the embodiment here, the main magnetic pole layer 40 has a structure wherein, as shown in FIG. 3, a main magnetic pole 15 and a magnetic pole main layer 19 are stacked together in order and thereby coupled to each other.

The main magnetic pole 15 functions as a portion for releasing off a main writing magnetic flux. This main magnetic pole 15 extends rearward from the air bearing surface 70 on the leading side, more specifically, as far as the back gap 50BG.

As shown in FIG. 4, for instance, the main magnetic pole 15 is configured in a generally battledore type planar shape. To be more specific, the main magnetic pole 15 comprises, in order from the air bearing surface 70, a front end 15A that extends rearward from that air bearing surface 70 and having a constant width W1 for defining the recording track width of the recording medium and a rear end 15B that is linked to the rear of that front end 15A and having a width W4 greater than the width W1 (W4>W1). The position at which the width of the main magnetic pole 15 starts growing wide from the front end 15A (of width W1) toward the rear end 15B (of width W4) is a "flare point FP".

The front end 15A is primarily adapted to substantially release a recording magnetic flux produced at the thin-film coil 22 toward the recording medium, and has an exposed surface 15M exposed on the air bearing surface 70, as shown in FIG. 4.

As shown typically in FIG. 5, the exposed surface 15M takes a planar shape defined by an upper end edge (one end edge) E1 positioned on the trailing side, a lower end edge (another end edge) E2 positioned on the leading side, and two side end edges S1 and S2. To be more specific, the exposed surface 15M typically assumes on a trapezoidal shape with its width becoming gradually narrow from the trailing side toward the leading side (W1>W3). The trailing edge T1 of the front end 15A provides a substantial recording site of the magnetic pole layer 40.

The rear end 15B shown in FIG. 4 is adapted to receive the magnetic flux received in the magnetic pole main layer 19 and feed it to the front end 15A. Typically, the width of this rear end 15B remains constant (width W4) in the rear, and becomes gradually narrow from width W4 to width W1 in the front as the front end 15A comes near.

The magnetic pole main layer 19 functions as a portion adapted to receive a dominant magnetic flux. Typically, this magnetic pole main layer 19 extends rearward from a position P1 (the first position) receded from the air bearing surface 70.

As shown typically in FIG. 4, the magnetic pole main layer 19 has a rectangular planar shape of width W4.

The insulating layer 16 is provided to isolate the main magnetic pole 15 electrically from the surroundings. This insulating layer 16 is made of a nonmagnetic insulating material such as alumina.

The gap layer 17 is formed in such a way as to provide a gap for the magnetic separation of the magnetic layer 40 from the write shield layer 60.

The insulating layer 50 defines the throat height TH that is one of important determinants for the recording performance of the thin-film magnetic head, and is adapted to cover the thin-film coil 22 in such a way as to isolate it electrically from the surroundings.

As shown in FIG. 3, the insulating layer 50 has a structure wherein an auxiliary insulating layer 20 (the first insulating layer portion) formed in such a way as to substantially define the throat height TH and a main insulating layer 21 (the second insulating layer portion) formed in such a way as to substantially cover the thin-film coil 22 are stacked one upon another in that order.

As shown in FIG. 3, the auxiliary insulating layer 20 extends along the gap layer 17 and from a position receded from the air bearing surface 70, viz., a position P2 (the second position) between the air bearing surface 70 and a position P1 to the position P1 in the rear. And, the auxiliary insulating layer 20 is provided in such a way as to be adjacent to the magnetic pole main layer 19 at the position P1, and adjacent to the write shield layer 60 (the TH defining layer 18 to be described later) at the position P2. In the embodiment here in particular, the auxiliary insulating layer 20 defines a flat plane HM together with the magnetic pole main layer 19 and TH defining layer 18.

The aforesaid "position P2" is corresponding to the foremost end position of the insulating layer 50 (nearest to the air bearing surface 70). That is, there is a "zero throat height position TP" for defining the throat height TH. That throat height TH is a distance between the air bearing surface 70 and the zero throat height position TP. This auxiliary insulating layer 20 is made of a nonmagnetic insulating material such as alumina. In the embodiment shown in FIGS. 3 and 4, the zero throat height position TP is in coincidence with the flare point FP.

As shown in FIG. 3, the main insulating layer 21 extends rearward from a position P3 (the third position) between the positions P1 and P2 while lying along the flat plane HM of the auxiliary insulating layer 20. More specifically, the main insulating layer 21 extends in such a way as not to fill up the back gap 50BG, and is receded from the auxiliary insulating layer 20. As shown typically in FIG. 3, this main insulating layer 21 comprises a main insulating layer portion 21A that is located as an underlay of the thin-film coil 22 on the flat plane HM of the auxiliary insulating layer 20, and a main insulating layer portion 21B that is located in such a way as to cover the thin-film coil 22 and the main insulating layer portion 21A around it.

The main insulating layer portion 21A is made of a nonmagnetic material such as alumina.

The main insulating layer portion 21B is made of a nonmagnetic insulating material such as a photoresist or spin-on-glass (SOG).

The thin-film coil 22 is formed for the generation of a recording magnetic flux. For instance, the thin-film coil 22 operates such that currents flow in the direction opposite to the direction taken by currents through the aforesaid thin-film coil 10.

The write shield layer 60 works capturing the spreading component of a recording magnetic flux released off the magnetic pole layer 40, thereby holding back the spreading of that magnetic flux.

The write shield layer 60 here comprises the TH defining layer 18 (the first magnetic shield layer portion) and a yoke layer 23 (the second magnetic shield layer portion) that are separate from each other, and has a structure wherein the TH defining layer 18 and yoke layer 23 are coupled to each other.

The TH defining layer 18 functions as a dominant magnetic flux inlet port adapted to capture an extra portion of the magnetic flux released directly from the magnetic pole.

The TH defining layer 18 is made of a magnetic material having a high saturation flux density such as permalloy or iron alloys, and assumes on a rectangular planar shape having a width W5 larger than the width W4 of the main magnetic pole layer 40 (W5>W4), as shown in FIG. 4.

The yoke layer 23 is set up in such a way as to function as a passage for the magnetic flux captured out of the TH defining layer 18, and function as a return yoke for allowing the magnetic flux to go back from the lining layer of the medium.

In the embodiment here, for instance, the yoke layer 23 extends as far as the rear of the back gap 50BG while linked to the main magnetic pole layer 40 at the back gap 50BG.

For such a thin-film magnetic head as described above, it is desired that constant dimensions defined on the basis of a specific component element be optimized to make sure recording performance, as typically shown in FIG. 3.

It is here noted that the whole structure of the thin-film magnetic head as described above is never limited to that described above, and so may be modified in various ways.
(Explanation of One Example of How the Thin-Film Magnetic Head Works)

Reference is now made to how the thin-film magnetic head according to the aforesaid embodiment works.

The thin-film magnetic head records information in the recording medium by the recording head, and plays back the information recorded in the recording medium by the reproducing head.

At the reproducing head, the direction of a bias magnetic field applied by the bias magnetic field-applying layers 106 is orthogonal to the direction perpendicular to the medium opposite plane 70 (ABS 70). At the CPP-GMR device 500 with no signal magnetic field applied yet, the magnetization direction of the free layer 150 lies in the direction of the bias magnetic field, and the magnetization direction of the fixed magnetization layer 130 is fixed in the direction perpendicular to the medium opposite plane 70 (ABS 70).

At the CPP-GMR device 500, there is a change in the magnetization direction of the free layer 150 depending on a signal magnetic field from the recording medium, which in turn causes a change in the relative angle between the magnetization direction of the free layer 150 and the magnetization direction of the fixed magnetization layer 130, with the result that there is a change in the resistance value of the CPP-GMR device 500. The resistance value of the CPP-GMR device 500 may be found from a potential difference between the first and second shield layers 3 and 5, i.e., the two electrode layers 3 and 5 at the time when a sense current is passed through the MR device. It is thus possible for the reproducing head to play back the information recorded in the recording medium.

[Explanation of the Hard Disk System]

One each example of the head stack assembly and the hard disk system according to the embodiment here is now explained with reference to FIGS. 6 and 7.

Figure 6:
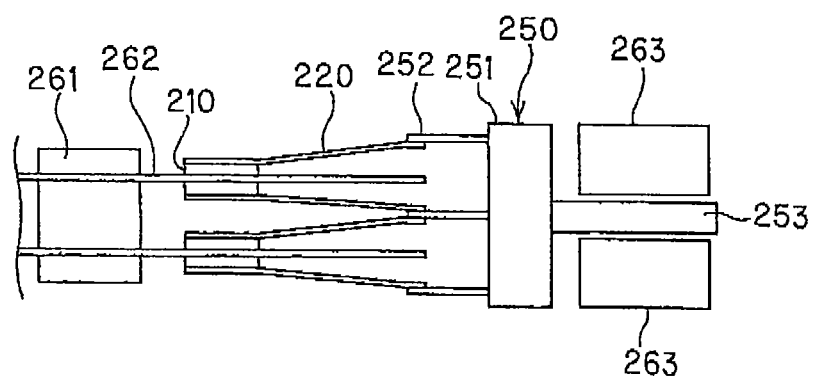
FIG. 6 is illustrative of part of the hard disk system.
Figure 7:
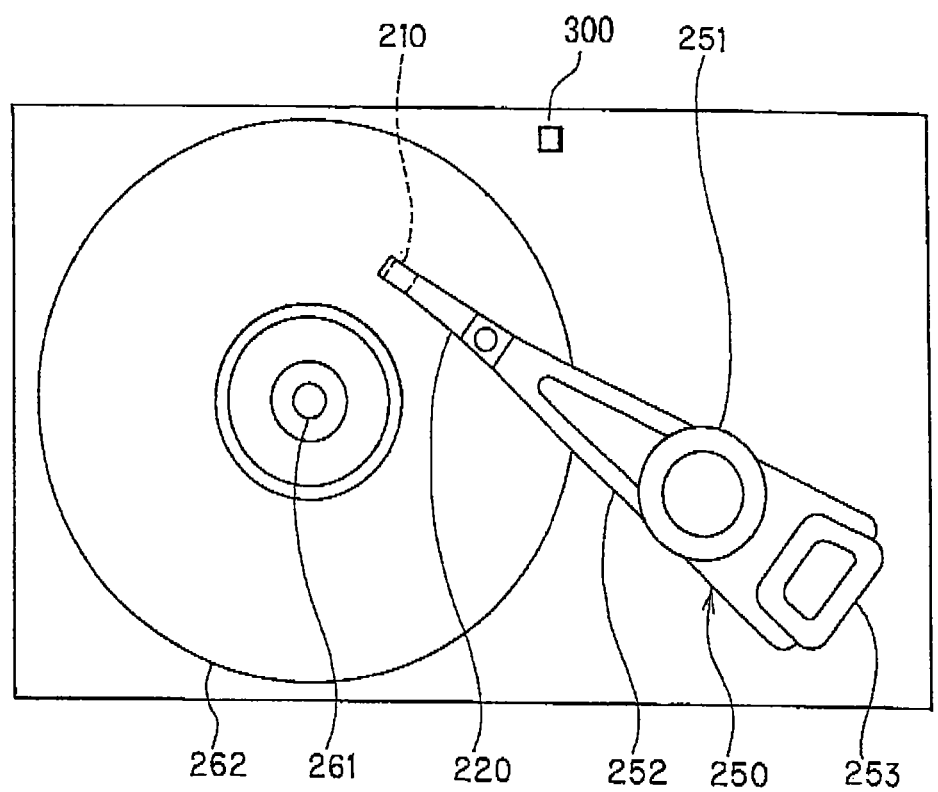
FIG. 7 is a plan view of the hard disk system.

FIG. 6 is illustrative of part of the hard disk system, and FIG. 7 is a plan view of the hard disk system.

A head stack assembly 250 comprises a carriage 251 having a plurality of arms 252. The plurality of arms 252 are provided with a plurality of the head gimbal assemblies 220 such that they line up perpendicularly at an interval. On the side of the carriage 251 that faces away from the arms 252, there is a coil 253 attached, which coil becomes a part of the voice coil motor. The head stack assembly 250 is incorporated in the hard disk system.

The hard disk system comprises a plurality of hard disks 262 attached to a spindle motor 261. For each hard disk 262, two sliders 210 are located such that they are opposite to each other with the hard disk 262 held between them. The voice coil motor has also permanent magnets 263 located at opposite positions with the coil 253 of the head stack assembly 250 held between them.

The head stack assembly 250 except the slider 210 and the actuator correspond to the positioning device here which is operable to support the slider 210 and position it relative to the hard disk 262.

With the hard disk system here, the actuator is actuated to move the slider 210 in the track traverse direction of the hard disk 262, thereby positioning the slider 210 with respect to the hard disk 262. The thin-film magnetic head incorporated in the slider 210 works such that information is recorded by a recording head in the hard disk 262, and the information recorded in the hard disk 262 is played back by a reproducing head.

[Explanation of the Method of Fixing Up the Deteriorations of the Magneto-Resistive Effect Device—Part of the Invention]

The invention is directed to a method of fixing up a deteriorated site in the magneto-resistive effect device (reproducing device) of a thin-film magnetic head caused by the so-called thermal asperity occurring as a hard disk system is in operation, while that device remains incorporated in the hard disk system without dismantling it.

Therefore, the inventive method is exclusively based the assumption that while the user uses a hard disk system in a completed product form, there is deterioration of the magneto-resistive effect device (reproducing device). This deterioration is caused by the thermal asperity.

As already noted, the thermal asperity is a phenomenon that occurs when a thin-film magnetic head passes over a magnetic disk plane that is a recording medium while levitating and flying over minute bumps or dents, because the magneto-resistive effect device is heated or cooled via the adiabatic compression and/or adiabatic expansion of air. Of course, that phenomenon occurs not only in a non-contact state but also in a contact state where the magneto-resistive effect device is in contact with minute bumps or dents on the magnetic disk plane. When the head is in collision with minute asperities, there is a local, vigorous heating occurring due to mechanical vibrations and, at the same time, instantaneous friction. Such local heating is supposed to occur for a very short period in which the head passes over the asperities, and propagate right away to the whole device. When heat shocks propagate as if they were waves, the device is supposed to undergo repeated local expansion and local shrinkage.

Figure 8A:
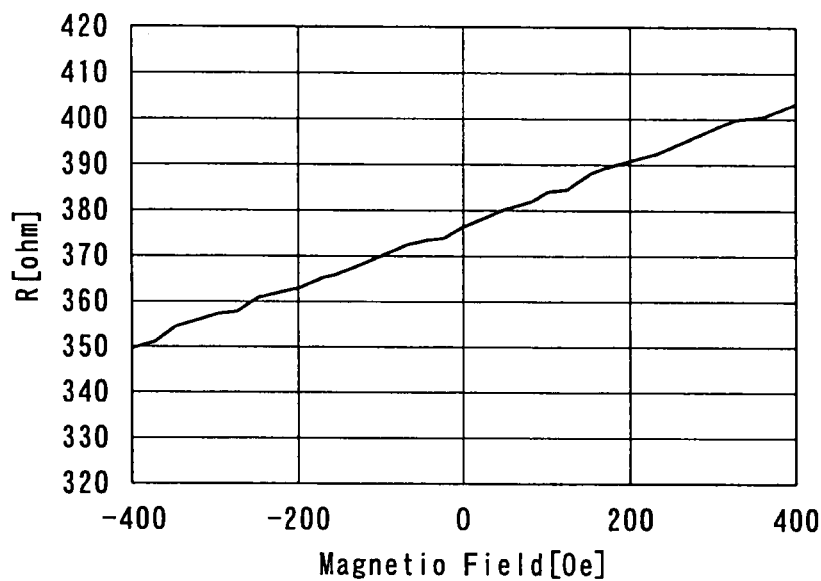
FIGS. 8A and 8B are graphs indicative of how typical thermal asperity deteriorations occur.
Figure 8B:
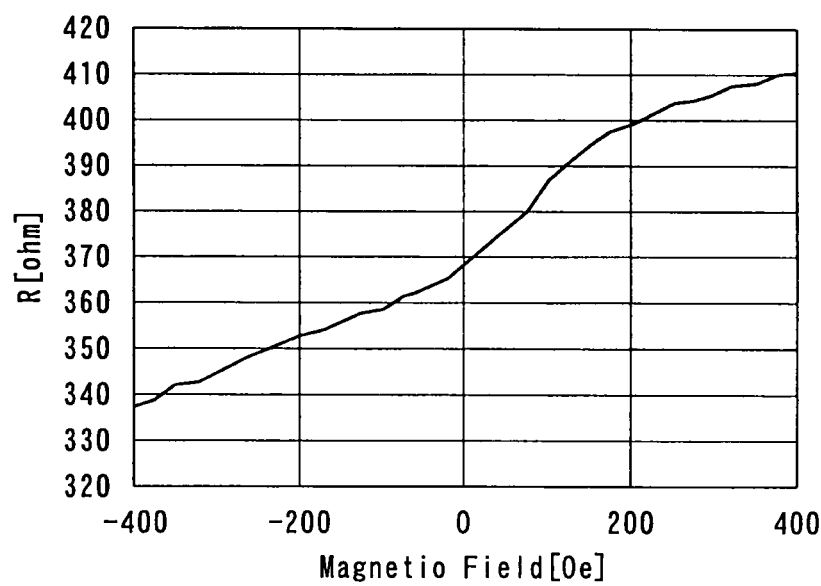

Mostly when there is malfunction by the thermal asperity, the device is going to show a stepwise resistance change (kink), not a linear resistance change of some inclination, with respect to an applied magnetic field, as shown in FIG. 8B. When there is deterioration in this mode, it has been ascertained that the deterioration is fixed up by the application of a magnetic field of the order of a few KOe. With this in mind, that deterioration mode would be triggered by the fact that the magnetization state of a part of the device is confined in a quasi-stable state. The thermal asperity reaches a high-temperature or high-energy state within a very short time. Some magnetization whose coercive force is instantaneously lost turns in a random direction. Thereafter, the thermal asperity cools rapidly down to room temperature at which that some magnetization is confined (fixed) in place while it stays in the random state, i.e., it turns in a direction it should not.

It is (1) the bias magnetic field-applying layer for applying a bias magnetic field to the magneto-resistive effect device, and (2) the fixed magnetization layer (pinned layer) forming part of the magneto-resistive effect device that corresponds to a defective site of the magneto-resistive effect device confined in the quasi-stable state here. Usually, there is often the bias magnetic field-applying layer involved.

Even when there is the kink involved as shown in FIG. 8B, the waveform is not an impeccably rectangular one, i.e., it does not show the behavior of the free layer having none of the bias magnetic field: there is a waveform with some bias magnetic field applied to it. In other words, even when there is deterioration in the bias magnetic field-applying layer as an example, the bias magnetic field decreases to some extents only: it is unlikely to vanish off completely. From this, it is found that the defective site confined in the quasi-stable state is only a part of the bias magnetic field-applying layer or the pinned layer.

To allow the defective site of the magneto-resistive effect device caused by such thermal asperity to go back to normal, the hard disk system is provided in it with a head heating means adapted to heat the thin-film magnetic head. And this head heating means works the way the defective site of the magneto-resistive effect device confined in the quasi-stable state as the hard disk system is in operation is heated in such a way as to return to its own normal stable state, thereby fixing up the deterioration of the device.

In the cases of the aforesaid (1) and (2), the area of some part confined by the thermal asperity in the quasi-stable state is allowed by thermal energy obtained through the inventive heating means and a magnetic field interaction from an area where most magnetization turns in the normal direction to go back to its own normal stable state, so that the direction of magnetization of some magnetic particles turns to the bias or pinned direction they should.

The first head heating means preferable here is a heater structure built in the thin-film magnetic head. When the thin-film magnetic head performs poorly, this heater structure is actuated to heat the head so that the magneto-resistive effect device can perform back in its own normal stable state. For instance, the heater structure may be fabricated using thin-film stack technologies. In addition, the heater structure may be designed in terms of location, heat capacity, heater on-off control, etc. such that the magneto-resistive effect device can effectively be heated. For the purpose of fixing up the deterioration, the magneto-resistive effect device may be heated in such a way as to reach a temperature of 100 to 220° C., and both the heating and the cooling rate for the device may be set at about $10^5$ to $10^{6\circ}$ C./sec.

The second heating means preferable here is a heating pad 300, see FIG. 7, located at a standby (rest) position for the thin-film magnetic head. In this case, the head heating means is located at a specially set place at which the thin-film magnetic head rests on standby. The standby place may be either a temporary one or a long-term one. For instance, the heating pad 300 may be heated by a heater. For the purpose of fixing up the deterioration, the magneto-resistive effect device may be heated in such a way as to reach the predetermined temperature, and both the heating and the cooling rate for the device may be set, as is the case with the first preferable embodiment.

Explanation of the Specific Experimental Example

A thin-film magnetic head sample comprising a magneto-resistive effect device having such structure as shown in FIGS. 1, 2 and 3 was prepared. This sample was used until there was the state of FIG. 8B reached. Then, experimentation of checking whether or not the sample went back to the state of FIG. 8A by the inventive deterioration fixing method was conducted.

The construction of part of the multilayer film structure of the specific device used is tabulated in Table 1 and given in the "additional components" just below it.

TABLE 1

| Multilayer Structure | | Layer Material | Thickness (nm) |
|---|---|---|---|
| Upper Shield Layer (5) | | NiFe | 100 |
| Cap Layer (126) | | Ta | 3 |
| Magneto-Resistive Effect Device | Second Ferromagnetic Layer (150) | CoFe | 5 |
| | Nonmagnetic Intermediate Layer (140) | MgO | 2 |
| | First Ferromagnetic Layer (130) | CoFe | 5 |
| Antiferromagnetic Layer (122) | | IrMn | 7 |
| Lower Shield Layer (3) | | NiFe | 100 |

Additional Components
Bias magnetic field-applying layer 106 (material: CoPt)
Insulating layer 104 (material: $Al_2O_3$)
Underlay layer 121 (material: Ta/Ru)

Figure 9A:
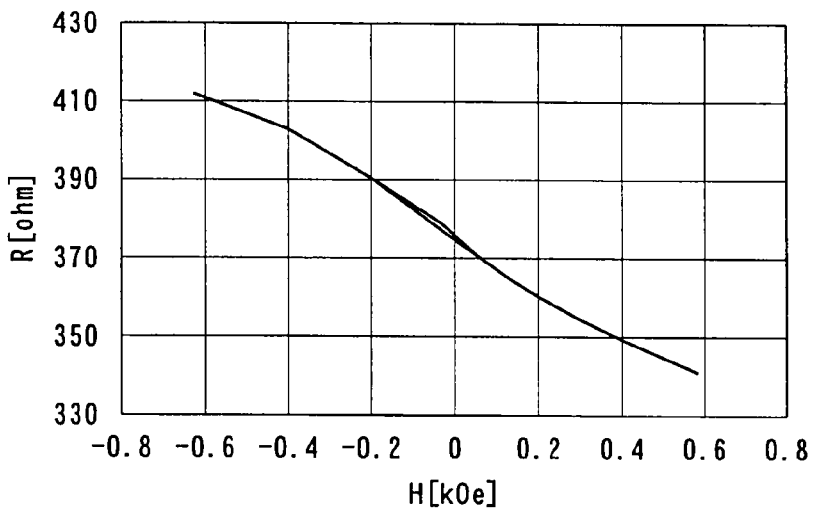
FIG. 9A shows a QST waveform in an initial state of the device in an embodiment of the invention.
Figure 9B:
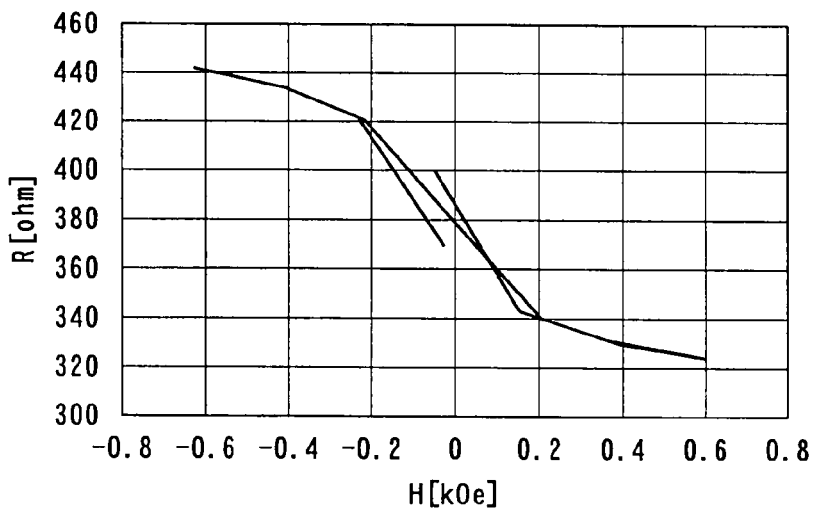
FIG. 9B shows a QST waveform when the device deteriorates.

Thin-film magnetic head samples comprising the thus formed magneto-resistive effect device were estimated for robustness to sort out a deteriorated sample. The state of deterioration was checked up by measuring QST (quasi-static test) waveforms. Consequently, it has been found that there is a stepwise resistance change (kink) occurring with respect to the applied magnetic field, as shown in FIG. 9B. FIG. 9A shows a QST waveform in the initial state before deterioration occurs.

Then, the deterioration fixing method of the invention was applied to this deteriorated sample (the state of FIG. 9B) in the following manner. That is, the head was unloaded to pass currents through a resistor integrated near the deteriorated device (a depth position as viewed from the ABS) to heat the device under the following conditions:

Heating Power: 50 mW (corresponding to about 100° C.)
Heating Time: 100 heating cycles, each for 5 msec., were carried out.

Figure 9C:
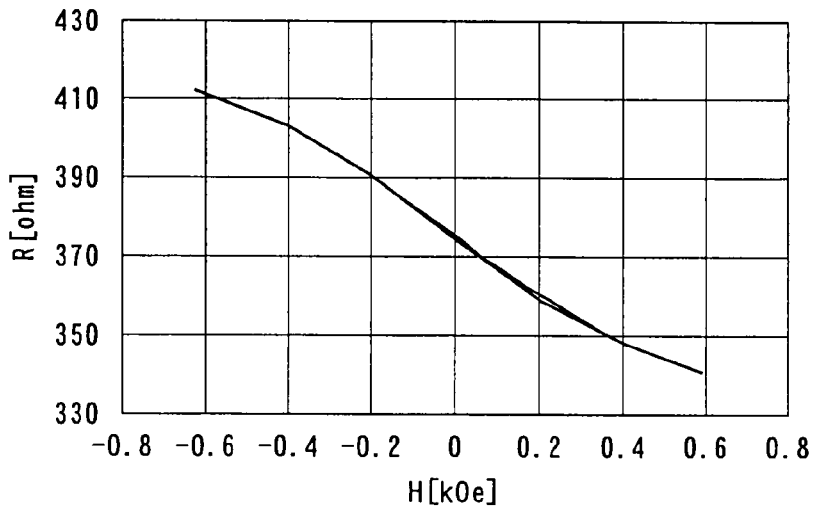
FIG. 9C shows a QST waveform indicative of a state where the deterioration of the device is fixed up by the invention.

Consequently, the QST waveform was restored back to normal, as shown in FIG. 9C.

From the aforesaid results, the advantages of the invention would be undisputed. That is, according to the inventive method for fixing up the deterioration of a magneto-resistive effect device, the hard disk system is provided in it with a head heating means for heating a thin-film magnetic head, and by that head heating means, a defective site of the magneto-resistive effect device, which occurs as the hard disk system is in operation and is confined in the quasi-stable state, is fixed up in such a way as to return back to its own normal stable state. Thus, the deteriorated site of the magneto-resistive effect device (reproducing device) in the thin-film magnetic head, which is caused by the so-called thermal asperity as the hard disk system is in operation, is fixed up while it remains built in the hard disk system, i.e., without dismantling the hard disk system.

Referring to the industrial applicability of the invention, the invention could be used in the industry of hard disk systems comprising a magneto-resistive effect device for reading the magnetic field strength of a magnetic recording disk or the like as signals.

We claim:

1. A method for fixing up deterioration of a magneto-resistive effect device in a thin-film magnetic head built in a hard disk system, in which the method is exclusively based on a situation that a user uses the hard disk system in a completed product form, the method comprising:
    providing a head heating means for heating the thin-film magnetic head in the hard disk system, and
    without dismantling the hard disk system, said head heating means to heat a defective site of the magneto-resistive effect device which occurs as the hard disk system is in operation and is confined in a quasi-stable state in such a way as to return back to an own normal stable state of the magneto-resistive effect device, thereby fixing up the deterioration of the device,
    wherein said head heating means is a heater mechanism built in the thin-film magnetic head.

2. The method for fixing up deterioration of a magneto-resistive effect device according to claim 1, wherein the defective site of said magneto-resistive effect device confined in the quasi-stable state is a bias magnetic field-applying layer for applying a bias to said device.

3. The method for fixing up deterioration of a magneto-resistive effect device according to claim 1, wherein the defective site of said magneto-resistive effect device confined in the quasi-stable state is a fixed magnetization layer that forms a part of said device.

4. The method for fixing up deterioration of a magneto-resistive effect device according to claim 1, wherein said hard disk system comprises:
    a slider located in opposition to a recording medium,
    a positioning device for supporting said slider and positioning said slider with respect to said recording medium, and
    a magneto-resistive effect device formed at a surface of said slider in opposition to the recording medium.

5. The method for fixing up deterioration of a magneto-resistive effect device according to claim 1, wherein said magneto-resistive effect device has a CPP (current perpendicular to plane) structure comprising:
    a spacer layer, and
    a first ferromagnetic layer and a second ferromagnetic layer stacked and formed such that said spacer layer is sandwiched between them, with a sense current applied in a stacking direction, wherein said device structure is provided with bias magnetic field-applying layers on both ends in a widthwise direction of the CPP structure.

6. A method for fixing up deterioration of a magneto-resistive effect device in a thin-film magnetic head built in a hard disk system, in which the method is exclusively based on a situation that a user uses the hard disk system in a completed product form, the method comprising:
    providing a head heating means for heating the thin-film magnetic head in the hard disk system, and
    without dismantling the hard disk system, said head heating means to heat a defective site of the magneto-resistive effect device which occurs as the hard disk system is in operation and is confined in a quasi-stable state in such a way as to return back to an own normal stable state of the magneto-resistive effect device, thereby fixing up the deterioration of the device, wherein said head heating means is a heating pad located at a standby position for the thin-film magnetic head.

7. The method for fixing up deterioration of a magneto-resistive effect device according to claim 6, wherein the defective site of said magneto-resistive effect device confined in the quasi-stable state is a bias magnetic field-applying layer for applying a bias to said device.

8. The method for fixing up deterioration of a magneto-resistive effect device according to claim 6, wherein the defective site of said magneto-resistive effect device confined in the quasi-stable state is a fixed magnetization layer that forms a part of said device.

9. The method for fixing up deterioration of a magneto-resistive effect device according to claim 6, wherein said hard disk system comprises:

a slider located in opposition to a recording medium, a positioning device for supporting said slider and positioning said slider with respect to said recording medium, and a magneto-resistive effect device formed at a surface of said slider in opposition to the recording medium.

10. The method for fixing up deterioration of a magneto-resistive effect device according to claim 6, wherein said magneto-resistive effect device has a CPP (current perpendicular to plane) structure comprising:

a spacer layer, and a first ferromagnetic layer and a second ferromagnetic layer stacked and formed such that said spacer layer is sandwiched between them, with a sense current applied in a stacking direction, wherein said device structure is provided with bias magnetic field-applying layers on both ends in a widthwise direction of the CPP structure.

* * * * *